US011688680B2

(12) United States Patent
Liang et al.

(10) Patent No.: US 11,688,680 B2
(45) Date of Patent: Jun. 27, 2023

(54) MIM CAPACITOR STRUCTURES

(71) Applicant: International Business Machines Corporation, Armonk, NY (US)

(72) Inventors: Jim Shih-Chun Liang, Poughkeepsie, NY (US); Baozhen Li, South Burlington, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/089,946

(22) Filed: Nov. 5, 2020

(65) Prior Publication Data

US 2022/0139820 A1    May 5, 2022

(51) Int. Cl.
*H01L 23/522* (2006.01)
*H01L 49/02* (2006.01)
*H01L 21/768* (2006.01)

(52) U.S. Cl.
CPC .... *H01L 23/5223* (2013.01); *H01L 21/76895* (2013.01); *H01L 23/5222* (2013.01); *H01L 28/56* (2013.01); *H01L 28/90* (2013.01); *H01L 23/5226* (2013.01)

(58) Field of Classification Search
CPC ...... H01L 23/5223; H01L 28/56; H01L 28/90
See application file for complete search history.

(56) References Cited

U.S. PATENT DOCUMENTS

| 6,232,154 B1 | 5/2001 | Reith et al. |
| 6,770,554 B1 | 8/2004 | Welstand |
| 7,135,366 B2 | 11/2006 | Rotella |
| 7,598,592 B2* | 10/2009 | Chen ............. H01L 23/5223 257/307 |
| 9,614,086 B1* | 4/2017 | Yeo ............. H01L 29/7848 |
| 10,062,683 B1* | 8/2018 | Yang ............. H01L 28/40 |

(Continued)

FOREIGN PATENT DOCUMENTS

KR    1020070052484 A    5/2007

OTHER PUBLICATIONS

Ando et al., "CMOS Compatible MIM Decoupling Capacitor with Reliable Sub-nm EOT High-k Stacks for the 7 nm Node and Beyond," 2016 IEEE International Electron Devices Meeting (IEDM), IEEE, 2016, 4 pages.

(Continued)

*Primary Examiner* — Ahmed N Sefer
(74) *Attorney, Agent, or Firm* — Jeffrey M. Ingalls (57) ABSTRACT

An integrated circuit structure is provided. The integrated circuit structure includes a back end of line (BEOL) wiring layer including metal lines and a first area between the metal lines. The integrated circuit structure also includes a metal-insulator-metal (MIM) capacitor formed in the first area. The MIM capacitor includes a first electrode, a first dielectric layer formed on the first electrode, a second electrode formed on the first dielectric layer, a second dielectric layer formed on the second electrode, a third electrode formed on the second dielectric layer, a third dielectric layer formed on the third electrode, a fourth electrode formed on the third dielectric layer, a first metal interconnect electrically connecting the first electrode and the third electrode, and a second metal interconnect electrically connecting the second electrode to the fourth electrode.

17 Claims, 7 Drawing Sheets

(56) References Cited

U.S. PATENT DOCUMENTS

| | | | |
|---|---|---|---|
| 2002/0192919 A1* | 12/2002 | Bothra | H01L 28/60 |
| | | | 438/381 |
| 2004/0073881 A1 | 4/2004 | Nassif et al. | |
| 2006/0177981 A1 | 8/2006 | Hierlemann | |
| 2006/0189069 A1 | 8/2006 | Coolbaugh et al. | |
| 2006/0237819 A1* | 10/2006 | Kikuta | H01L 23/5223 |
| | | | 257/532 |
| 2007/0228506 A1* | 10/2007 | Min | H01G 4/33 |
| | | | 257/499 |
| 2009/0013298 A1 | 1/2009 | Fouad et al. | |
| 2010/0213572 A1 | 8/2010 | Ching et al. | |
| 2010/0219502 A1 | 9/2010 | Shieh et al. | |
| 2010/0224960 A1* | 9/2010 | Fischer | H01L 28/86 |
| | | | 257/532 |
| 2010/0237465 A1* | 9/2010 | Stribley | H01G 4/33 |
| | | | 257/532 |
| 2010/0237467 A1* | 9/2010 | Dalton | H01L 21/76834 |
| | | | 257/E29.325 |
| 2011/0156205 A1* | 6/2011 | Maki | H03F 3/45188 |
| | | | 257/532 |
| 2013/0270675 A1* | 10/2013 | Childs | H01L 23/5223 |
| | | | 257/532 |
| 2014/0145307 A1 | 5/2014 | Chen et al. | |
| 2014/0159200 A1* | 6/2014 | Loke | H01L 23/5223 |
| | | | 257/532 |
| 2014/0367757 A1* | 12/2014 | Jakushokas | H01G 4/33 |
| | | | 257/306 |
| 2015/0221716 A1* | 8/2015 | Jakushokas | H01G 4/33 |
| | | | 257/306 |
| 2016/0026064 A1* | 1/2016 | Masuyama | G02F 1/025 |
| | | | 385/2 |
| 2017/0040411 A1* | 2/2017 | Kawa | H01G 4/008 |
| 2018/0006108 A1 | 1/2018 | Ando et al. | |
| 2018/0076134 A1* | 3/2018 | Jing | H01L 23/5225 |
| 2018/0122893 A1* | 5/2018 | Yang | H01L 21/76865 |
| 2018/0331173 A1* | 11/2018 | Leobandung | H01L 23/5223 |
| 2019/0013269 A1* | 1/2019 | Zhang | H01L 28/60 |
| 2019/0341347 A1* | 11/2019 | Li | H01L 23/5223 |
| 2020/0020644 A1* | 1/2020 | Lee | G06F 30/398 |
| 2020/0098518 A1* | 3/2020 | Lee | H01L 27/0805 |
| 2021/0098564 A1* | 4/2021 | Yin | H01L 28/56 |
| 2021/0296428 A1* | 9/2021 | Jin | H01L 21/02 |
| 2022/0123101 A1* | 4/2022 | Li | H01L 28/40 |

OTHER PUBLICATIONS

Li et al., "On Integrated Circuit (IC) Device Capacitor Between Metal Lines", Filed Mar. 16, 2020, U.S. Appl. No. 16/819,291.

Cremer et al., "High Performances 3D Damascene MIM Capacitors Integrated in Copper Back-End Technologies", Proc. IEEE Bipolar/BiCMOS Circuits and Technology Meeting, 2006, 4 pages.

Jeannot et al., "Toward next high performances MIM generation: up to 30fF/$\mu m^2$ with 3D architecture and high-k materials", Proc. IEEE IEDM, 2007, 4 pages.

Combined Search and Examination Report, GB2114896.0, dated Mar. 10, 2022, 6 pages.

* cited by examiner

MIM CAPACITOR STRUCTURES

BACKGROUND

The present disclosure relates to the electrical, electronic and computer fields. In particular, the present disclosure relates to metal-insulator-metal (MIM) capacitors having different plate structures. Typically, the MIM capacitor has a sandwich structure and can be described as a parallel plate capacitor. The capacitor top metal (CTM) is separated from the capacitor bottom metal (CBM) by a thin insulating dielectric layer.

Metal-insulator-metal (MIM) capacitors may be used in high performance applications in complementary metal-oxide-semiconductor (CMOS) technology. For example, MIM capacitors have been used in functional circuits such as mixed signal circuits, analog circuits, radio frequency (RF) circuits, dynamic random access memory (DRAM), embedded DRAM, and logic operation circuits. In system-on-chip (SOC) applications, different capacitors for different functional circuits have to be integrated on a same chip to serve different purposes. For example, in mixed signal circuits, capacitors are used as decoupling capacitors and high-frequency noise filters. For DRAM and embedded DRAM circuits, capacitors are used for memory storage. However, for RF circuits, capacitors are used in oscillators and phase-shift networks for coupling and/or bypassing purposes. For microprocessors, capacitors may be used for decoupling. The high frequency and low power of semiconductor chips may require a large number of decoupling capacitors. MIM capacitors have been used for decoupling in these applications.

SUMMARY

Certain embodiments relate to an integrated circuit structure. The integrated circuit structure includes a back end of line (BEOL) wiring layer including metal lines and a first area between the metal lines. The integrated circuit structure also includes a metal-insulator-metal (MIM) capacitor formed in the first area. The MIM capacitor includes a first electrode, a first dielectric layer formed on the first electrode, a second electrode formed on the first dielectric layer, a second dielectric layer formed on the second electrode, a third electrode formed on the second dielectric layer, a third dielectric layer formed on the third electrode, a fourth electrode formed on the third dielectric layer, a first metal interconnect electrically connecting the first electrode and the third electrode, and a second metal interconnect electrically connecting the second electrode to the fourth electrode.

Other embodiments of the present disclosure relate to a method of manufacturing an integrated circuit structure. The method includes forming a back end of line (BEOL) wiring layer including metal lines and a first area between the metal lines. The method also includes forming a metal-insulator-metal (MIM) capacitor in the first area by forming a first electrode, forming a first dielectric layer on the first electrode, forming a second electrode on the first dielectric layer, forming a second dielectric layer on the second electrode, forming a third electrode on the second dielectric layer, forming a third dielectric layer on the third electrode, forming a fourth electrode on the third dielectric layer, forming a first metal interconnect to electrically connect the first electrode and the third electrode, and forming a second metal interconnect to electrically connect the second electrode to the fourth electrode.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

The present disclosure describes metal-insulator-metal (MIM) capacitor devices and methods of manufacturing MIM capacitor devices. In particular, the present disclosure describes MIM capacitor devices that are located in areas between trace metal lines of a semiconductor device, and that include at least four or five MIM plates (i.e., alternating metal and insulator layer).

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a MIM capacitor refers to a capacitor having a stacked structure, for example, including a bottom electrode, a top electrode, and an insulator therebetween. More specifically, a MIM capacitor is commonly used in high performance applications in CMOS technology. Typically, the MIM capacitor has a sandwich structure and can be described as a parallel plate capacitor. The capacitor top metal (CTM) is separated from the capacitor bottom metal (CBM) by a thin insulating dielectric layer. Both parallel plates are typically formed from TiN that are patterned and etched through the use of several photolithography photomasking steps. The thin insulating dielectric layer is typically made from silicon oxide, silicon nitride, or high K dielectric materials, such as $AL_2O_3$, $HfO_2$, $ZrO_2$ or a combination of these, deposited by chemical vapor deposition (CVD), for example. Certain of the present embodiments describe MIM capacitors having more than the traditional three plates (i.e., a first metal layer, an insulator layer, and a second metal layer). For example, certain of the present embodiments describe four and five plate MIM capacitors.

As discussed herein, the high frequency and the low power of semiconductor chips may require a large number of decoupling capacitors. MIM capacitors have been used for decoupling in these applications. These capacitors can take up valuable chip area and impact the overall size of the chip.

Certain areas of a semiconductor wafer, such as the metal fill shape areas between metal wirings, may often utilize dummy metal fill shapes. These dummy metal fill shapes do not contribute in any way to the performance of the device and are used primarily to meet the uniform metal density requirements for effective chemical mechanical planarization (CMP), patterning, and etching. In other words, CMP performance can be degraded if there are areas with low amounts of metal objects. Where uniform metal density requirements are not met, metal dishing and/or dielectric erosion can occur, which can undesirably result in surface topography after CMP (i.e., rather than planarization). Certain of the present embodiments locate the MIM capacitors in these metal fill shape areas rather than using dummy metal fill shapes. In this way, there is the benefit of using decoupling capacitors in areas that would not normally be functional. Moreover, the MIM capacitors include metal layers that are able to contribute to meeting the uniform metal density requirements of CMP and other processes.

Figure 1A:
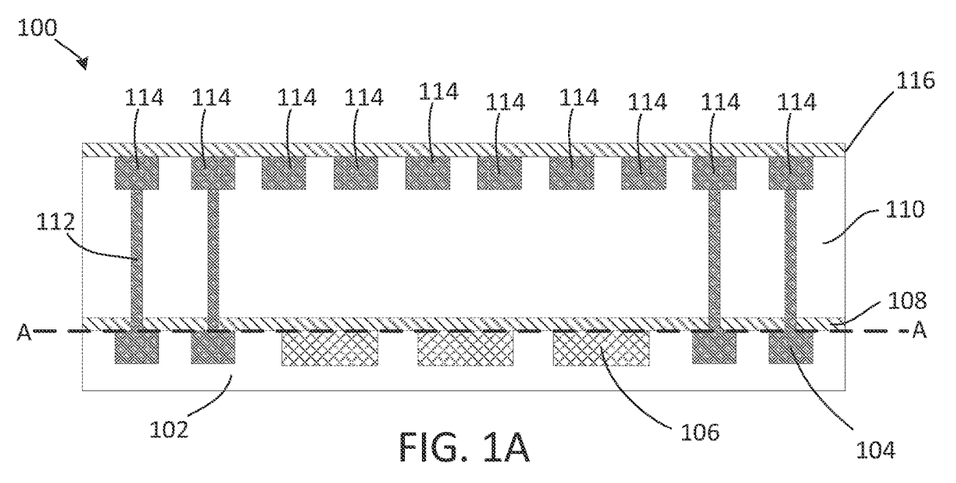
FIG. 1A is a cross-sectional view of an example semiconductor device, illustrating the use of dummy electrodes in empty areas between metal lines.
Figure 1B:
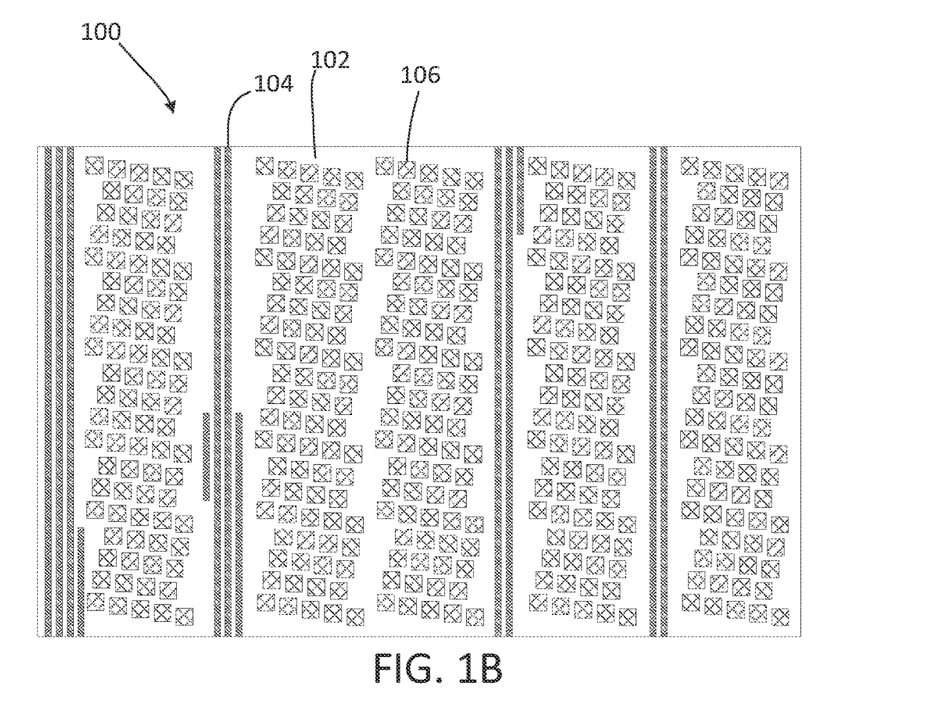
FIG. 1B is a plan view of the example semiconductor device of FIG. 1A.

Referring now to the drawings in which like numerals represent the same or similar elements and initially to FIGS. 1A and 1B, an example semiconductor device 100 is shown that includes dummy electrodes 106 (i.e., metal fill shapes). In this example, a semiconductor wafer or substrate 102 is provided. Several back end of line (BEOL) wiring levels of a semiconductor integrated circuit are shown. Lower level wiring lines 104 and dummy electrodes 106 are formed in a lower portion of FIG. 1A. A capping layer 108 is formed on lower level wiring lines 104 and dummy electrodes 106. The capping layer 108 may be formed of, for example, AN, SiN, SiCN, a combination thereof, or any other suitable dielectric material. An interlayer dielectric layer 110 is formed on lower capping layer 108, and several metal interconnects 112 extend upward through the dielectric layer 110 to contact upper level wiring lines 114. An upper capping layer 116 is formed on the upper level wiring lines 114. The upper capping layer 116 may be made of the same or similar materials as the lower capping layer 116. Because the dummy electrodes 106 are not functional in the semiconductor device, they do not connect to the lower wiring lines (not shown) or the upper wiring lines 114. However, as mentioned above, they do have the effect of increasing the metal density in the otherwise "empty" area between the active metal lines (e.g., a combination of upper level wiring line 114, metal interconnect 112 and lower level wiring line 104). This allows for an improvement in the performance of the CMP processing, but the dummy electrodes 106 are utilizing valuable space on the semiconductor wafer.

Referring now to FIG. 1B, this figure shows a plan view of the semiconductor device 100 shown in FIG. 1A taken along the cut line A-A. FIG. 1B shows one example of an arrangement pattern of the dummy electrodes 106, and how much space they can occupy in the empty areas between adjacent lower level wiring lines 104.

Figure 2A:
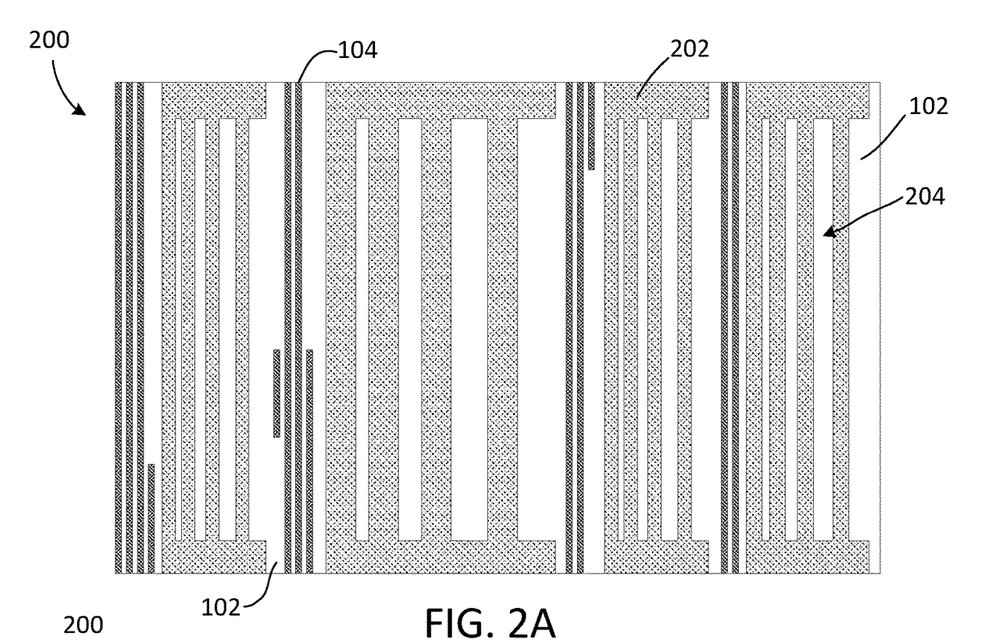
FIG. 2A is a plan view of example shapes of a bottom electrode of a multi-plate MIM capacitor device in empty areas between metal lines, according to embodiments.
Figures 2B, 2C:
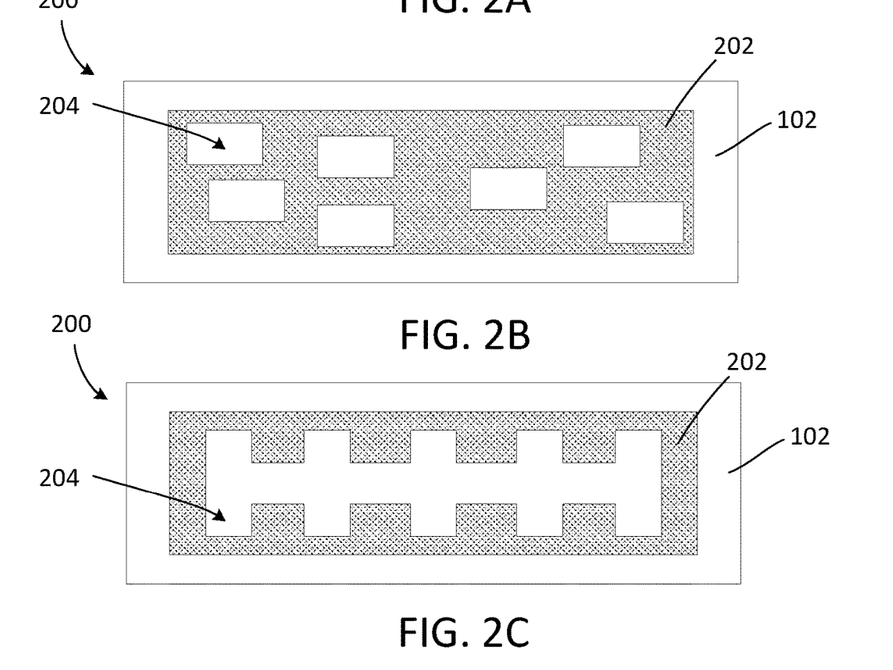
FIG. 2B is a plan view of another example shape of a bottom electrode of a multi-plate MIM capacitor, according to embodiments.
FIG. 2C is a plan view of another example shape of a bottom electrode of a multi-plate MIM capacitor, according to embodiments.

Referring now to FIGS. 2A-2C, several example shapes of a bottom electrode (or first electrode 202) of a MIM capacitor device 200 are shown, according to certain embodiments. In each of these figures, a first electrode 202 has varying shapes with differing patterns of openings 204 therein. It should be appreciated that the first electrode 202 may have any suitable shape that meet the uniform metal density requirements of CMP and that optimize the MIM capacitor density over the entire semiconductor wafer substrate 102.

Figure 3A:
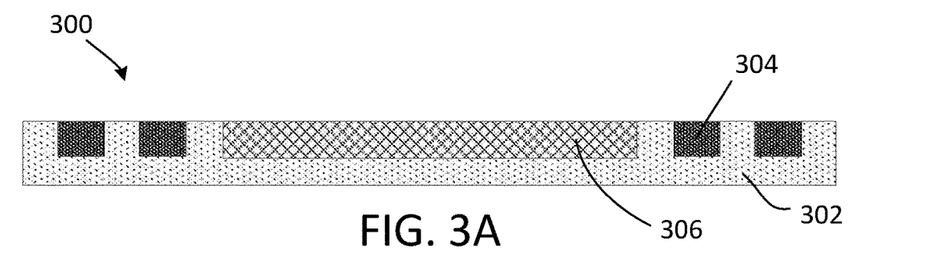
FIG. 3A is a cross-sectional view depicting a multi-plate MIM capacitor device at an intermediate stage of the manufacturing process, according to embodiments.
Figure 3B:
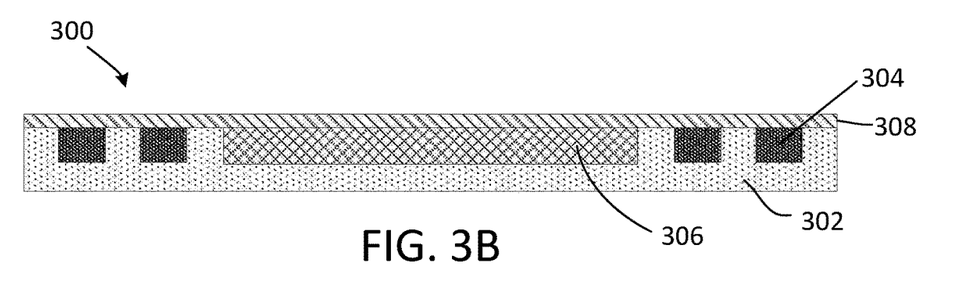
FIG. 3B is a cross-sectional view of a multi-plate MIM capacitor device of FIG. 3A after additional fabrication operations, according to embodiments.

Referring now to FIGS. 3A-3M, and initially to FIG. 3A, an example embodiment illustrating a method of manufacturing a four plate MIM capacitor (MIMcap) device 300 is shown. As shown in FIG. 3A, a substrate 302 is provided. In certain examples, the substrate may be an interlayer dielectric layer deposited on a different BEOL layer (not shown). In FIG. 3A, a first (lower) wiring level 304 is shown for an example semiconductor device following the completion of several BEOL processing steps (e.g., etching, deposition, metal fill, planarization, etc.). In certain embodiments, rather than forming dummy electrodes as described above with respect to FIGS. 1A and 1B, a first electrode 306 (or bottom electrode) of the MIMcap device 300 is formed. As shown in FIG. 3B, a capping layer or first insulating layer 308 is formed atop the first wiring level 304, the first electrode 306, and surrounding interlevel dielectric layer or substrate 302. This first electrode 306 is the bottommost plate of the MIM capacitor. The capping layer (or first insulating layer 308) may be formed of, for example, AN, SiN, SiCN, a combination thereof, or any other suitable dielectric material.

Figure 3C:
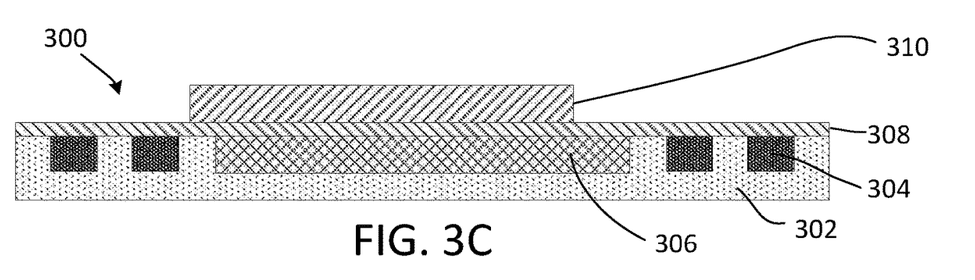
FIG. 3C is a cross-sectional view of a multi-plate MIM capacitor device of FIG. 3B after additional fabrication operations, according to embodiments.

Referring now to FIG. 3C, a metal plate 310 is formed on top of the first insulating layer 308. Although not shown in FIG. 3C, the metal plate 310 may be initially formed by a thick metal plate deposition process, followed by patterning the desired shape. In certain embodiments, the metal plate 310 is comprised of at least one of TiN, TaN, Al or any other suitable electrode material. As shown in FIG. 3C, the position of the metal plate 310 is offset somewhat to the left relative to the position of the first electrode 306. In particular, the right side of the metal plate 310 is further to the left than the right side of the first electrode 306, and the left side of the metal plate 310 is also further to the left than the left side of the first electrode 306. In certain embodiments, the metal plate 310 may be aligned with the first electrode 306.

Figure 3D:
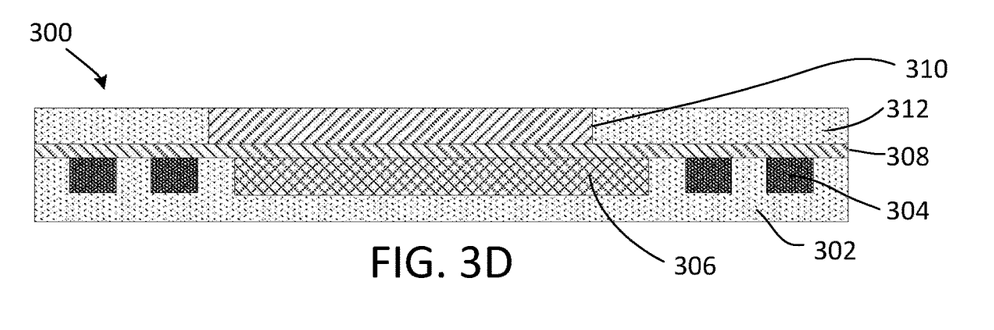
FIG. 3D is a cross-sectional view of a multi-plate MIM capacitor device of FIG. 3C after additional fabrication operations, according to embodiments.

Referring now to FIG. 3D, after patterning the metal plate 310 in FIG. 3C, a first interlayer dielectric layer 312 is formed to cover the surfaces of the first insulating layer 308 and the metal plate 310. Then, a CMP process or the like is used to planarize the surface of the first interlayer dielectric layer 312 and expose the upper surface of the metal plate 310.

Figure 3E:
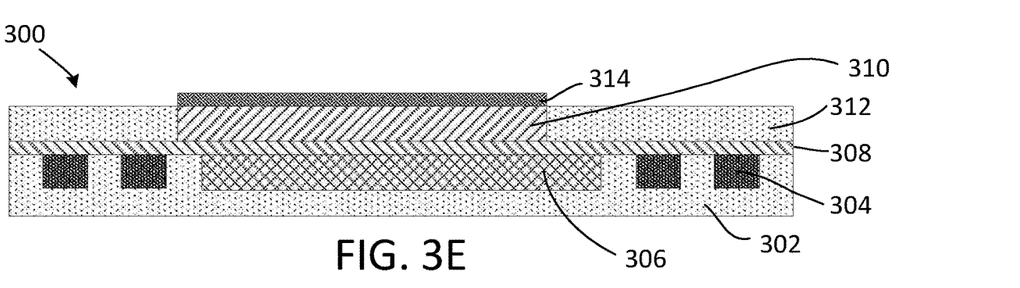
FIG. 3E is a cross-sectional view of a multi-plate MIM capacitor device of FIG. 3D after additional fabrication operations, according to embodiments.

Referring now to FIG. 3E, a second electrode 314 is formed on the metal plate 310 by deposition and patterning processes. In certain embodiments, the size and position of the second electrode 314 is generally the same as that of the thick metal plate 310. It could also be considered that the combination of the metal plate 310 and the second electrode 314 is actually a second electrode of the MIMcap device 300. In certain embodiments, the second electrode 314 is comprised of TiN, TaN or any other suitable electrode material. The material of this second electrode 314 may be the same as or different from the material of the underlying metal plate 310. It should be appreciated that in the case where the material of the second electrode 314 is the same as the material of the underlying metal plate 310, these two layers can be formed in a single step and be considered as a single layer.

Figure 3F:
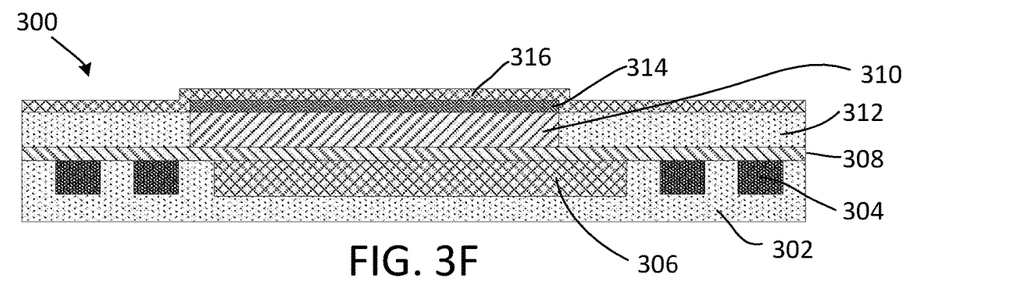
FIG. 3F is a cross-sectional view of a multi-plate MIM capacitor device of FIG. 3E after additional fabrication operations, according to embodiments.

Referring now to FIG. 3F, a first high-κ dielectric layer 316 is conformally deposited over the entire surface of the wafer. The conformal first high-κ dielectric layer 316 comprises a high-κ dielectric material. In general, the term high-κ refers to a material with a high dielectric constant (κ, kappa), as compared to silicon dioxide. High-κ dielectrics are used in semiconductor manufacturing processes where they are usually used to replace a silicon dioxide gate dielectric or another dielectric layer of a device. Thus, the term high-κ as used herein refers to a material having a relative dielectric constant κ which is much higher than that of silicon dioxide (e.g., a dielectric constant κ=25 for hafnium oxide ($HfO_2$) rather than 4 for silicon dioxide). Examples of suitable high-κ gate dielectric materials include, but are not limited to, $HfO_2$, $Al_2O_3$, $ZrO_2$ and/or lanthanum oxide ($La_2O_3$). Due to the conformal coating the first high-κ dielectric layer 316, the surface has a certain degree of topography, where the upper level of the high-κ dielectric layer 316 is higher in the area of the second electrode 314. However, it should be appreciated that in other embodiments, the first high-κ dielectric layer 316 could be deposited thicker and then planarized with CMP (which would require additional processing step).

Figure 3G:
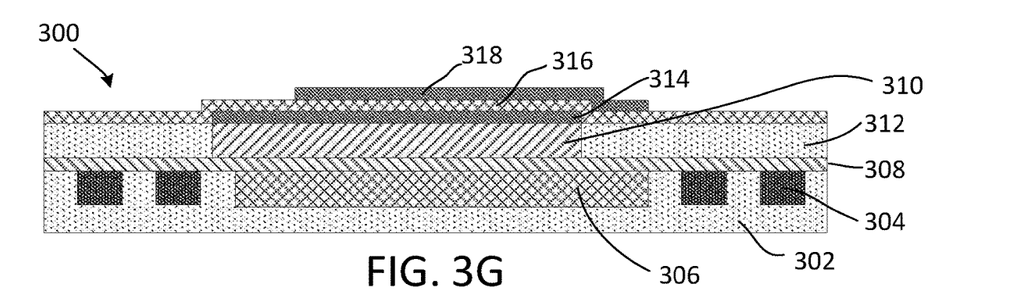
FIG. 3G is a cross-sectional view of a multi-plate MIM capacitor device of FIG. 3F after additional fabrication operations, according to embodiments.

Referring now to FIG. 3G, a third electrode 318 is formed on top of the first high-κ dielectric layer 316. Although not shown in FIG. 3G, the third electrode 318 may be initially formed by a deposition process, followed by patterning for the desired shape. In certain embodiments, the third electrode 318 is comprised of at least one of TiN, TaN, Al or any other suitable electrode material. As shown in FIG. 3G, the position of third electrode 318 is offset somewhat to the right relative to the position of the second electrode 314. In particular, the right side of the third electrode 318 is further to the right than the right side of the second electrode 314, and the left side of the third electrode 318 is also further to the right than the left side of the second electrode 314. In the example embodiment shown in FIG. 3G, the position of the right side of the third electrode 318 roughly corresponds to the position of the right side of the first electrode 306. This general alignment will allow for subsequent electrical connection between the first electrode 306 and third electrode 318, as discussed in detail below.

Figure 3H:
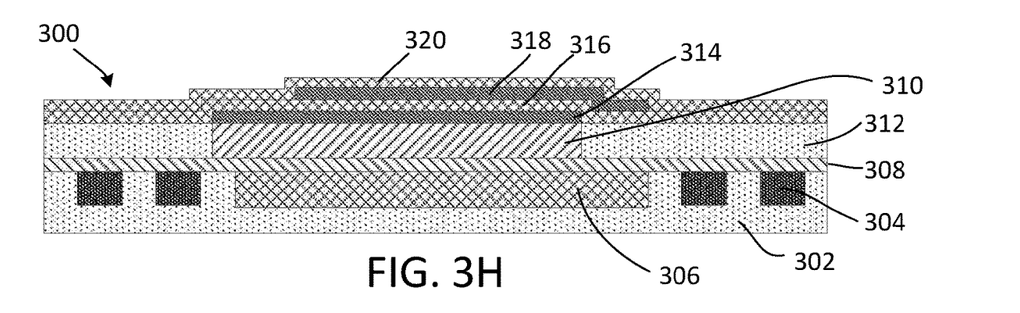
FIG. 3H is a cross-sectional view of a multi-plate MIM capacitor device of FIG. 3G after additional fabrication operations, according to embodiments.

Referring now to FIG. 3H, a second high-κ dielectric layer 320 is conformally deposited over the entire surface of the wafer. The conformal second high-κ dielectric layer 320 comprises a high-κ dielectric material, which may be the same or different from the material of the first high-κ dielectric layer 316. Again, due to the conformal coating the first high-κ dielectric layer 316 and second high-κ dielectric layer 320, as well as the formation of the second electrode 314 and third electrode 318, the surface has a certain degree of topography.

Figure 3I:
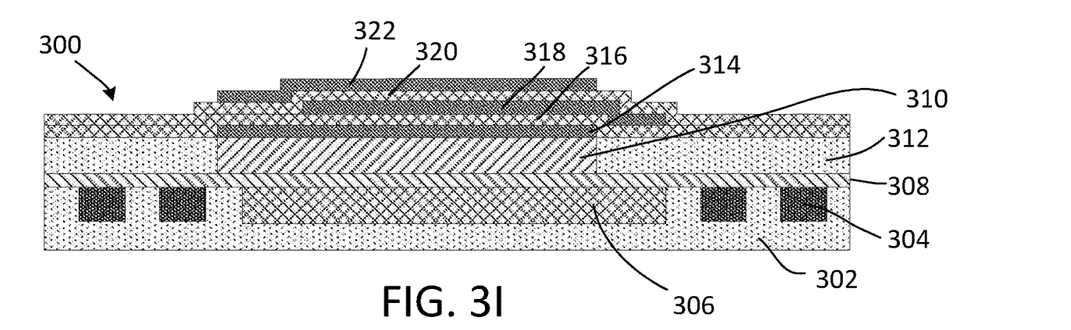
FIG. 3I is a cross-sectional view of a multi-plate MIM capacitor device of FIG. 3H after additional fabrication operations, according to embodiments.

Referring now to FIG. 3I, a fourth electrode 322 is formed on the second high-κ dielectric layer 320 by deposition and patterning processes. The material of this fourth electrode 322 may be the same as or different from the materials of the underlying electrode layers. In certain embodiments, the size and position of the fourth electrode 322 is generally the same as that of the thick metal plate 310 and the second electrode 314, although this is not strictly required. This general alignment of the fourth electrode 322 will allow for subsequent electrical connection between the second electrode 314 and the fourth electrode 322, as discussed in detail below.

Figure 3J:
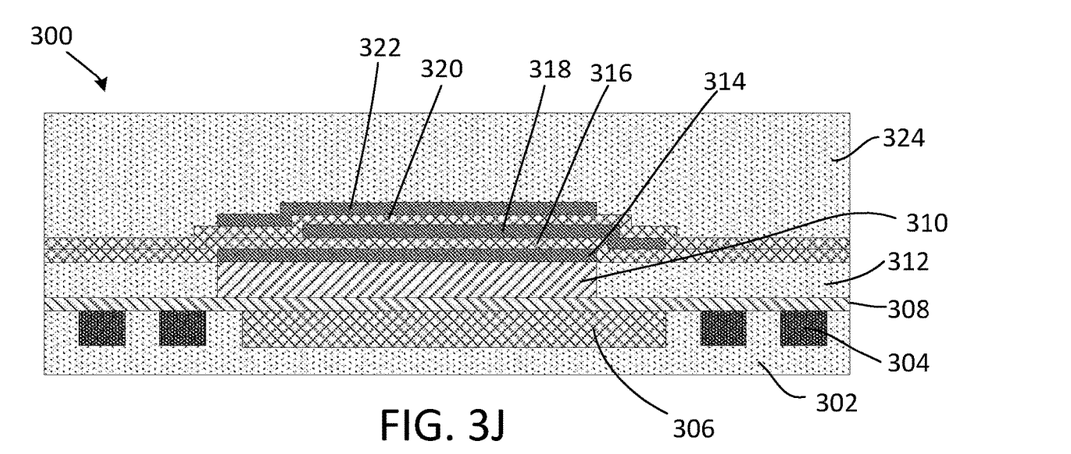
FIG. 3J is a cross-sectional view of a multi-plate MIM capacitor device of FIG. 3I after additional fabrication operations, according to embodiments.

Referring now to FIG. 3J, second interlayer dielectric layer 324 is formed over the entire surface of the wafer to cover the fourth electrode 322 and the second high-κ dielectric layer 320. Then, a CMP process is performed on the second interlayer dielectric layer 324 to planarize the surface of the layer.

In this example, the fourth electrode 322 has a stepped surface contour corresponding to a surface contour of the underlying second high-κ dielectric layer 320 (i.e., because the second high-κ dielectric layer 320 was conformally formed over all surfaces), and the third electrode 318 has a stepped surface contour corresponding to a surface contour of the underlying first high-κ dielectric layer 316 (i.e., because first high-κ dielectric layer 316 was conformally formed over all surfaces).

Figure 3K:
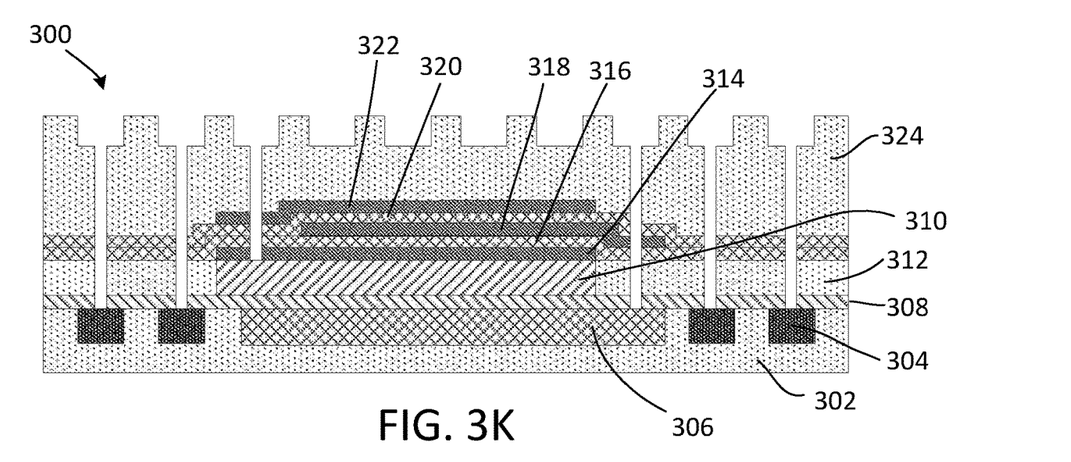
FIG. 3K is a cross-sectional view of a multi-plate MIM capacitor device of FIG. 3J after additional fabrication operations, according to embodiments.

Referring now to FIG. 3K, etching processes (e.g., RIE) are performed on the wafer to create spaces to form the subsequent metal interconnects and upper metal wiring lines of the BEOL layers. At the same time, etching is performed in the vicinity of the MIMcap device 300 to allow for subsequent electrical connections of the various MIMcap electrodes.

Figure 3L:
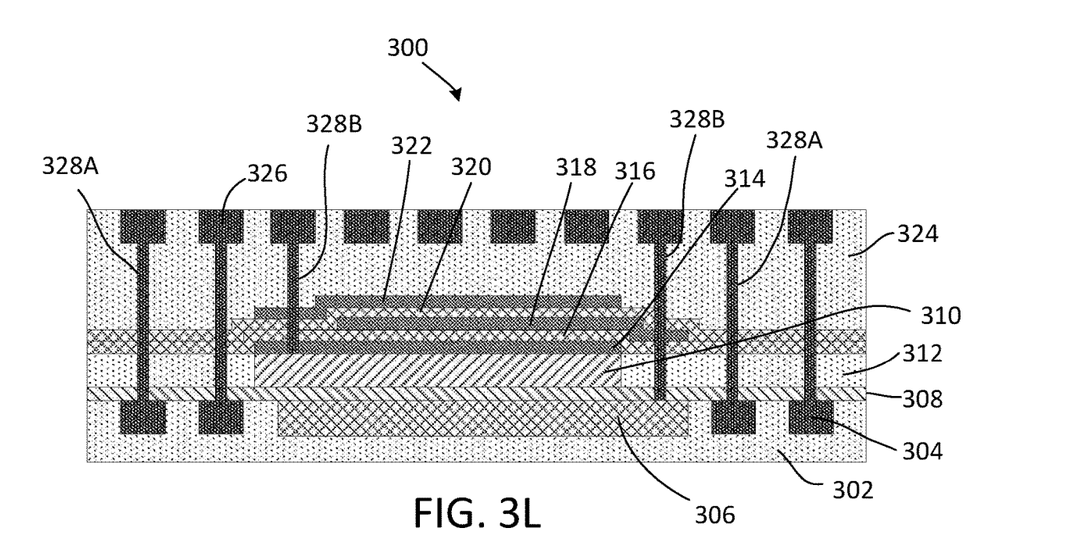
FIG. 3L is a cross-sectional view of a multi-plate MIM capacitor device of FIG. 3K after additional fabrication operations, according to embodiments.

Referring now to FIG. 3L, metal interconnects 328A and 328B and a second wiring level 326 (i.e., upper level wiring lines) are formed. In areas not corresponding to the MIMcap device 300, the metal interconnects 328A electrically connect the first wiring level 304 to the upper level or second wiring level 326 of the BEOL layers. However, in areas corresponding to the MIMcap device 300, the metal interconnects 328B electrically connect the various electrodes together. In particular, a right one of the metal interconnects 328B electrically connects the first electrode 306 to the third electrode 318, and a left one of the metal interconnects 328B electrically connects the second electrode 314 to the fourth electrode 322.

In certain embodiments, all electrodes (i.e., 306, 310, 314, 318 and 322) are all aligned vertically. In this case, a through hole larger than the via size will be needed on the electrode, where there is no contact between the electrode and via to allow the via 328 to pass through. In these embodiments, through hole is made where contact between the electrode and via is needed.

Figure 3M:
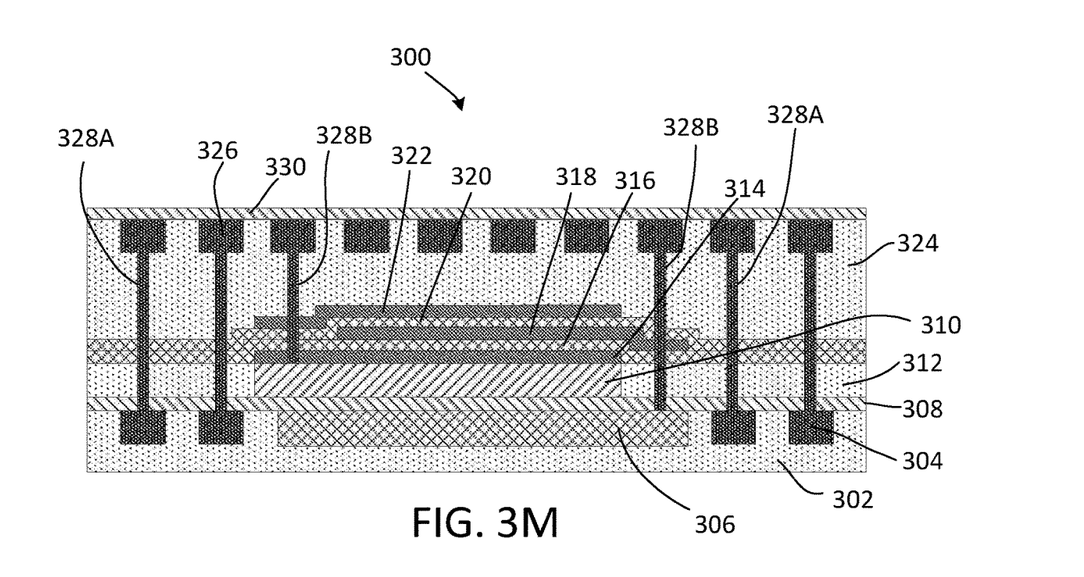
FIG. 3M is a cross-sectional view of a multi-plate MIM capacitor device of FIG. 3L after additional fabrication operations, according to embodiments.

Referring now to FIG. 3M, another capping layer or second insulating layer 330 is formed atop the second wiring level 326, and the surrounding second interlayer dielectric layer 324. Thus, a four plate MIMcap device 300 is formed where two of the four electrodes connect on the right side, and the other two of the electrodes connect together on the left side. Moreover, in certain embodiments, only one additional mask is required (i.e., for formation of the metal plate 310), and only four additional processing steps are required to incorporate the MIMcap device 300 structure into empty space between the wiring lines in the BEOL layer. In other embodiments, more than one additional mask may be required, where in addition to pattering the metal plate 310, it is also necessary to pattern the third electrode 318 and the second high-κ dielectric layer 320. In these embodiments, there may be more than four additional processing steps.

Figure 4:
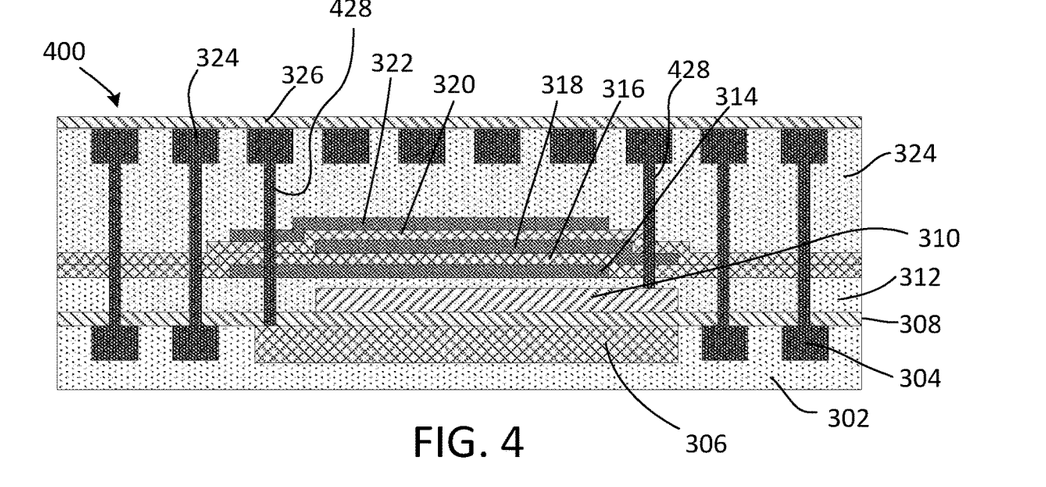
FIG. 4 is a cross-sectional view depicting a multi-plate MIM capacitor device, according to embodiments.

Referring now to FIG. 4, an example embodiment illustrating a method of manufacturing a five plate MIM capacitor (MIMcap) device 400 is shown. Much of the processing of the MIMcap device 400 in FIG. 4 is the same as that described above with respect to FIGS. 3A-3M and will not be repeated here. However, there are certain differences. First, the position of the metal plate 310 is shifted to the right relative to the FIGS. 3A-3M embodiment. Second, a portion of the first interlayer dielectric layer 312 is interposed between the metal plate 310 and the second electrode 314 to electrically isolate these layers from each other. Third, the etching depths for the metal interconnects 428 in the area corresponding to the MIMcap device 400 are different. In particular, the metal interconnect 428 on the left side of the MIMcap device is formed down to a depth corresponding to an upper surface of the first electrode 306, thereby electrically connecting the first electrode 306, the second electrode 314 and the fourth electrode 322. Moreover, the metal interconnect 428 on the right side of the MIMcap device 400 is formed down to a depth corresponding to an upper surface of the metal plate 310, thereby electrically connecting the metal plate 310 to the third electrode 318. Therefore, there are five total conductive layers in this MIMcap device 400, three on the left side and two on the right side. The metal plate 310 may be considered to be a fifth electrode in this embodiment.

In this example, the fourth electrode 322 has a stepped surface contour corresponding to a surface contour of the underlying second high-κ dielectric layer 320 (i.e., because the second high-κ dielectric layer 320 was conformally formed over all surfaces), and the third electrode 318 has a stepped surface contour corresponding to a surface contour of the underlying first high-κ dielectric layer 316 (i.e., because first high-κ dielectric layer 316 was conformally formed over all surfaces).

Figure 5:
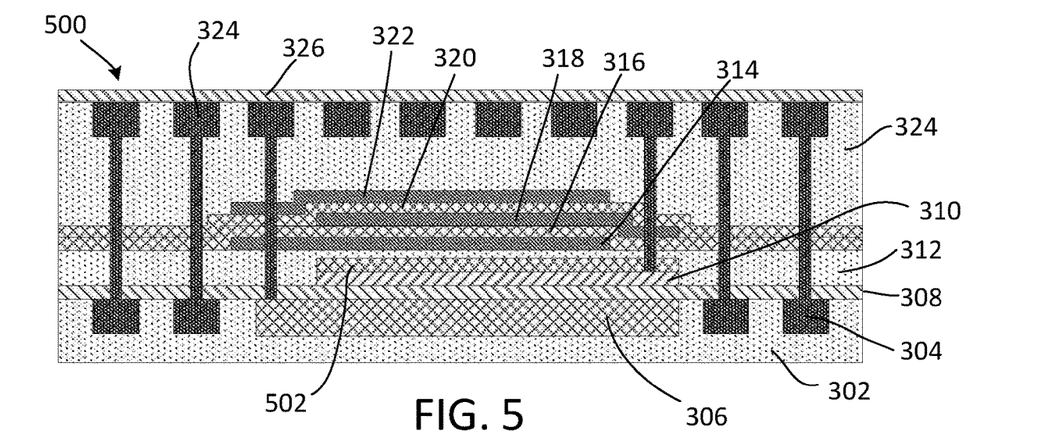
FIG. 5 is a cross-sectional view depicting a multi-plate MIM capacitor device, according to embodiments.

Referring now to FIG. 5, an example embodiment illustrating a method of manufacturing another five plate MIM capacitor (MIMcap) device 500 is shown. Much of the processing of the MIMcap device 500 in FIG. 5 is the same as that described above with respect to FIG. 4 and will not be repeated here. However, there are certain differences. In particular, a third high-κ dielectric layer 502 is formed between the metal plate 310 and the first interlayer dielectric layer 312. In certain embodiments, the second high-κ dielectric layer 502 is formed on top of the metal plate 310, and they are subsequently patterned together. In other embodiments, the second high-κ dielectric layer 502 is not patterned, and it covers the entire surface similar to the other high-κ dielectric layers described herein. Thus, in the embodiment shown in FIG. 5, there is a bilayer dielectric structure between the metal plate 310 and the second electrode 314, and this bilayer dielectric structure includes both the first interlayer dielectric layer 312 and the third high-κ dielectric layer 502.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
   a lower level back end of line (BEOL) wiring layer including lower level metal lines and an upper level BEOL wiring layer including upper level metal lines, the lower level metal lines connected to the upper level metal lines by an interconnect, the lower and upper level metal lines extending in a first direction in a plan view and defining a fill shape area therebetween in the plan view that does not include elements of the upper or lower level BEOL wiring layers; and
   a metal-insulator-metal (MIM) capacitor formed in the fill shape area that extends in a thickness direction of the integrated circuit structure at least partially from the lower level BEOL layer to the upper level BEOL layer and does not overlap in the plan view with the lower level metal lines or upper level metal lines,
   wherein a first electrode of the MIM capacitor is formed at a same level in the thickness direction as the lower level metal lines, and all remaining portions of the MIM capacitor are formed between the lower level metal lines and the upper level metal lines in the thickness direction.

2. The integrated circuit structure of claim 1, wherein the MIM capacitor includes:
   the first electrode,
   a first dielectric layer formed on the first electrode;
   a second electrode formed on the first dielectric layer;
   a second dielectric layer formed on the second electrode;
   a third electrode formed on the second dielectric layer;
   a third dielectric layer formed on the third electrode;
   a fourth electrode formed on the third dielectric layer;
   a first metal interconnect electrically connecting the first electrode and the third electrode; and
   a second metal interconnect electrically connecting the second electrode to the fourth electrode;
   wherein right sides of the first and third electrodes extend further to the right than right sides of the second and fourth electrodes, and
   wherein left sides of the second and fourth electrodes extend further to the left than left sides of the first and third electrodes.

3. The integrated circuit structure of claim 2, wherein the third electrode has a stepped surface contour corresponding to a surface contour of the underlying second dielectric layer, and the fourth electrode has a stepped surface contour corresponding to a surface contour of the underlying third dielectric layer.

4. The integrated circuit structure of claim 2, wherein the first dielectric layer, the second dielectric layer and the third dielectric layer each comprise at least one material selected from the group consisting of $HfO_2$, $Al_2O_3$, $ZrO_2$ and lanthanum oxide ($La_2O_3$).

5. The integrated circuit structure of claim 2,
   wherein the first metal interconnect extends vertically through the third dielectric layer, the third electrode, the second dielectric layer and the first dielectric layer, to contact the first electrode, and wherein the second metal interconnect extends vertically through the fourth electrode, the third dielectric layer and the second dielectric layer, to contact the second electrode.

6. The integrated circuit structure of claim 1, further comprising at least one dummy electrode formed in the fill shape area at a level of the upper level metal lines.

7. The integrated circuit structure of claim 1, wherein the MIM capacitor includes:
the first electrode,
a first dielectric layer formed on the first electrode,
a second electrode formed on the first dielectric layer,
an interlayer dielectric layer formed on the second electrode,
a third electrode formed on the interlayer dielectric layer,
a second dielectric layer formed on the third electrode,
a fourth electrode formed on the second dielectric layer,
a third dielectric layer formed on the fourth electrode,
a fifth electrode formed on the third dielectric layer,
a first metal interconnect electrically connecting the first electrode, the third electrode and the fifth electrode, and
a second metal interconnect electrically connecting the second electrode and the fourth electrode,
wherein left sides of the first, third and fifth electrodes extend further to the left than left sides of the second and fourth electrodes, and
wherein right sides of the second and fourth electrodes extend further to the right than right sides of the third and fifth electrodes.

8. The integrated circuit structure of claim 7, wherein the first electrode is formed of a same material and at a same level as the lower level metal lines.

9. The integrated circuit structure of claim 7, further comprising at least one dummy electrode formed in the fill shape area at a level of the upper level metal lines.

10. The integrated circuit structure of claim 7, wherein the fourth electrode has a stepped surface contour corresponding to a surface contour of the second dielectric layer, and the fifth electrode has a stepped surface contour corresponding to a surface contour of the third dielectric layer.

11. The integrated circuit structure of claim 7, wherein the first dielectric layer, the second dielectric layer, the interlayer dielectric layer, and the third dielectric layer, each comprise at least one material selected from the group consisting of $HfO_2$, $Al_2O_3$, $ZrO_2$ and lanthanum oxide ($La_2O_3$).

12. The integrated circuit structure of claim 7,
wherein the first metal interconnect extends vertically through the fifth electrode, the third dielectric layer, the second dielectric layer, the third electrode, the interlayer dielectric layer, and the first dielectric layer, to contact the first electrode, and
wherein the second metal interconnect extends vertically through the third dielectric layer, the fourth electrode, the third dielectric layer and the interlayer dielectric layer, to contact the second electrode.

13. A method of manufacturing an integrated circuit structure, the method comprising:

forming a lower level back end of line (BEOL) wiring layer including lower level metal lines and an upper level BEOL wiring layer including upper level metal lines, the lower level metal lines connected to the upper level metal lines by an interconnect, the lower and upper level metal lines extending in a first direction in a plan view and defining a fill shape area therebetween in the plan view that does not include elements of the upper or lower level BEOL wiring layers; and forming a metal-insulator-metal (MIM) capacitor in the first fill shape area that extends in a thickness direction of the integrated circuit structure at least partially from the lower level BEOL layer to the upper level BEOL layer and does not overlap in the plan view with the lower level metal lines or upper level metal lines,
wherein a first electrode of the MIM capacitor is formed at a same level in the thickness direction as the lower level metal lines, and all remaining portions of the MIM capacitor are formed between the lower level metal lines and the upper level metal lines in the thickness direction.

14. The method of claim 13, further comprising forming the MIM capacitor by:
forming the first electrode;
forming a first dielectric layer on the first electrode;
forming a second electrode on the first dielectric layer;
forming a second dielectric layer on the second electrode;
forming a third electrode on the second dielectric layer;
forming a third dielectric layer on the third electrode;
forming a fourth electrode on the third dielectric layer;
forming a first metal interconnect to electrically connect the first electrode and the third electrode; and
forming a second metal interconnect to electrically connect the second electrode to the fourth electrode,
wherein right sides of the first and third electrodes extend further to the right than right sides of the second and fourth electrodes, and
wherein left sides of the second and fourth electrodes extend further to the left than left sides of the first and third electrodes.

15. The method of claim 14, wherein the first electrode is formed of a same material and in a same processing step as the lower level metal lines.

16. The method of claim 14, wherein the third electrode has a stepped surface contour corresponding to a surface contour of the underlying second dielectric layer, and the fourth electrode has a stepped surface contour corresponding to a surface contour of the underlying third dielectric layer.

17. The method of claim 14,
wherein the first metal interconnect is formed to extend vertically through the third dielectric layer, the third electrode, the second dielectric layer and the first dielectric layer, to contact the first electrode, and
wherein the second metal interconnect is formed to extend vertically through the fourth electrode, the third dielectric layer and the second dielectric layer, to contact the second electrode.

* * * * *